US011395444B2

(12) United States Patent
Ratcliffe

(10) Patent No.: US 11,395,444 B2
(45) Date of Patent: Jul. 19, 2022

(54) COOLING ARRANGEMENT FOR A DRIVER ASSIST SYSTEM

(71) Applicant: TRW Automotive U.S. LLC, Livonia, MI (US)

(72) Inventor: Gregory L. Ratcliffe, Taylor, MI (US)

(73) Assignee: TRW AUTOMOTIVE U.S. LLC, Livonia, MI (US)

(*) Notice: Subject to any disclaimer, the term of this patent is extended or adjusted under 35 U.S.C. 154(b) by 1224 days.

(21) Appl. No.: 15/241,301

(22) Filed: Aug. 19, 2016

(65) Prior Publication Data
US 2017/0064877 A1 Mar. 2, 2017

Related U.S. Application Data

(60) Provisional application No. 62/208,990, filed on Aug. 24, 2015.

(51) Int. Cl.
H05K 7/20 (2006.01)
H04N 5/225 (2006.01)
B60R 1/00 (2022.01)

(52) U.S. Cl.
CPC ......... H05K 7/20872 (2013.01); B60R 1/00 (2013.01); H04N 5/2252 (2013.01); H04N 5/22521 (2018.08); H05K 7/20272 (2013.01); B60R 2300/80 (2013.01); H04N 5/2254 (2013.01)

(58) Field of Classification Search
None
See application file for complete search history.

(56) References Cited

U.S. PATENT DOCUMENTS

| 9,596,387 | B2 | 3/2017 | Achenbach et al. | |
| 2006/0133039 | A1* | 6/2006 | Belady | H01L 23/473 165/80.4 |
| 2006/0285226 | A1* | 12/2006 | Senba | G02B 15/143 359/694 |
| 2015/0015713 | A1* | 1/2015 | Wang | H04N 5/235 348/148 |
| 2016/0227079 | A1* | 8/2016 | Oh | B60R 11/04 |
| 2017/0070652 | A1* | 3/2017 | Müller | B60R 11/04 |

FOREIGN PATENT DOCUMENTS

| CN | 104349029 | 2/2015 |
| DE | 102012013193 | 1/2014 |
| DE | 1020140095614 | 12/2015 |
| JP | 2009100374 | 5/2009 |
| JP | 2009103111 | 5/2009 |

* cited by examiner

Primary Examiner — Kaitlin A Retallick
(74) Attorney, Agent, or Firm — Tarolli, Sundheim, Covell & Tummino LLP

(57) ABSTRACT

In accordance with one aspect of the present invention, a driver assist system for a vehicle includes a housing and a camera extending from the housing. A data processing circuit is mounted within the housing for processing and analyzing image data provided by the camera. A fluid filled heat sink transfers heat from the data processing circuit to the environment for cooling the data processing circuit.

17 Claims, 9 Drawing Sheets

COOLING ARRANGEMENT FOR A DRIVER ASSIST SYSTEM

RELATED APPLICATIONS

This application claims priority from U.S. Provisional Application Ser. No. 62/208,990, filed Aug. 24, 2015, the subject matter of which is incorporated herein in its entirety.

FIELD OF THE PRESENT INVENTION

The present invention is directed to a driver assist system and, more particularly, to a cooling arrangement for use with a driver assist system.

BACKGROUND

Vehicle drive assist systems ("DAS") are known in the art. Such systems use a camera to image the vehicle's external environment. A data processing circuit monitors image data from the camera, processes and analyzes the image data, and outputs signals to other vehicle systems indicative of the analyzed image information. The output signals from the data processing circuit of the DAS can provide information to the vehicle operator such as warning indications of a possible vehicle collision, a warning indication of a roadway or lane departure, pedestrian information, road sign information, traffic information, etc. The data processing circuit can also output information to vehicle actuatable systems such as braking, haptic feedback, etc. The processing circuitry of the DAS could also communicate with other vehicle systems that use the information to provide autonomous vehicle control.

The data processing circuit of a DAS utilizes significant energy to accomplish its data processing and analysis function which, in turn, generates a substantial amount of heat. Since the DAS data processing circuit is typically mounted on a printed circuit board which is, in turn, mounted in a housing structure, the generated heat from the processing circuitry is a concern. The housing structure may be mounted to a vehicle windshield and is relatively small so as not to interfere with the view of the vehicle operator. The small size of the DAS housing increases the heat problem.

SUMMARY OF THE PRESENT INVENTION

The present invention provides a liquid cooling arrangement for use with a driver assist system to dissipate heat generated by the associated processing circuitry located within the DAS housing.

In accordance with one aspect of the present invention, a driver assist system for a vehicle includes a housing and a camera extending from the housing. A data processing circuit is mounted within the housing for processing and analyzing image data provided by the camera. A fluid filled heat sink transfers heat from the data processing circuit to the environment for cooling the data processing circuit.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION

Figure 1:
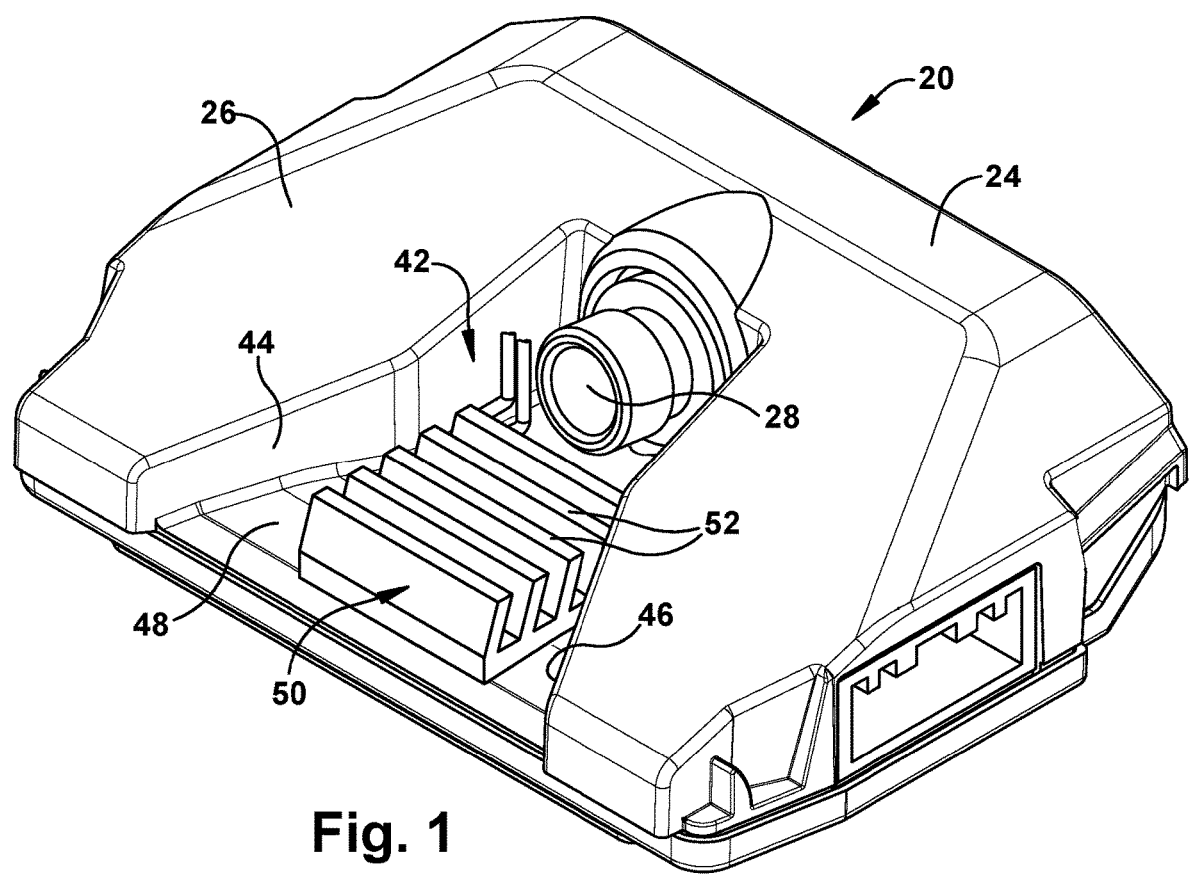
FIG. 1 is a perspective view of a driver assist system made in accordance with an example embodiment of the present invention.
Figure 2:
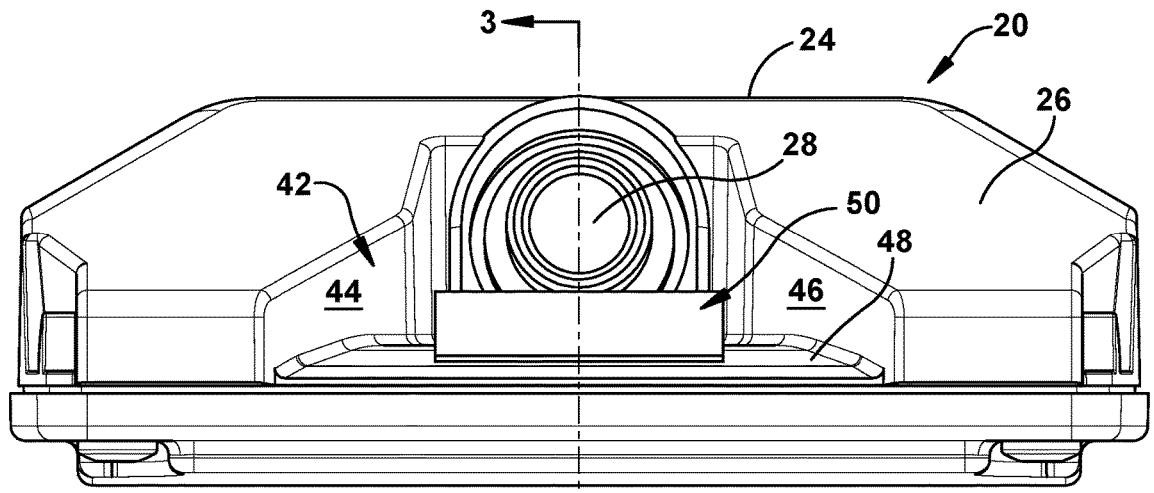
FIG. 2 is a front elevation view of the driver assist system shown in FIG. 1.

Referring to FIGS. 1-5, a driver assist system 20 is shown having a cooling arrangement made according to a first example embodiment of the present invention. The driver assist system 20 includes a housing 24 having a mounting face 26 engageable with a vehicle windshield (not shown). When attached to the vehicle windshield, the mounting face 26 extends substantially parallel to the vehicle's windshield. The housing 24 may be directly connected to the windshield or connected to a bracket fixed to the windshield.

A camera 28, data processing circuit 30, and a printed circuit board 32 are mounted in the housing 24. The lens of the camera 28 extends outward from the housing 24. The data processing circuit 30 is connected to the printed circuit board 32. The data processing circuit 30 monitors image data from the camera, processes and analyzes the image data, and outputs signals to other vehicle systems indicative of the analyzed image information.

The housing 24 includes a camera viewing window 42 through which the camera lens extends. The viewing window 42 is defined by sidewalls 44, 46 that extend from the mounting face 26 and a bottom wall 48 of the housing 24. The bottom wall 48 interconnects and extends between the sidewalls 44, 46. The lens of the camera 28 extends outward from the housing 24 and points toward the vehicle windshield when the housing is connected with the windshield. The camera 28 has a field of view of the environment in front of the vehicle. The DAS uses the camera 28 to monitor for such things as lane departure, traffic, pedestrians, etc. Although the present invention is described with regard to DAS that uses a forward looking camera, those skilled in the art will appreciate that the present invention is applicable to any DAS including a rearward looking camera system, sideways looking camera systems, etc. Also, the present invention is applicable to any DAS whether it uses a camera or some other form of sensing device. Also, the cooling arrangement of the present invention is applicable to any vehicle camera system.

The data processing circuit 30 in the form of an integrated circuit chip is attached to the printed circuit board 32. The data processing circuit 30 could be a microcontroller or an application specific integrated circuit. A fluid filled heat sink 50 is directly secured to and thermally coupled to the data processing circuit 30. Thus, the heat sink 50 engages the data processing circuit 30 so that the data processing circuit is located between the heat sink and the printed circuit board 32. The heat sink 50, in accordance with one example embodiment is sized so as to have a commensurate size as that of the data processing circuit 30 so as to entirely cover the top surface area of the data processing circuit 30. The heat sink 50 transfers heat from the data processing circuit 30 to the environment outside the housing 24.

Figure 3:
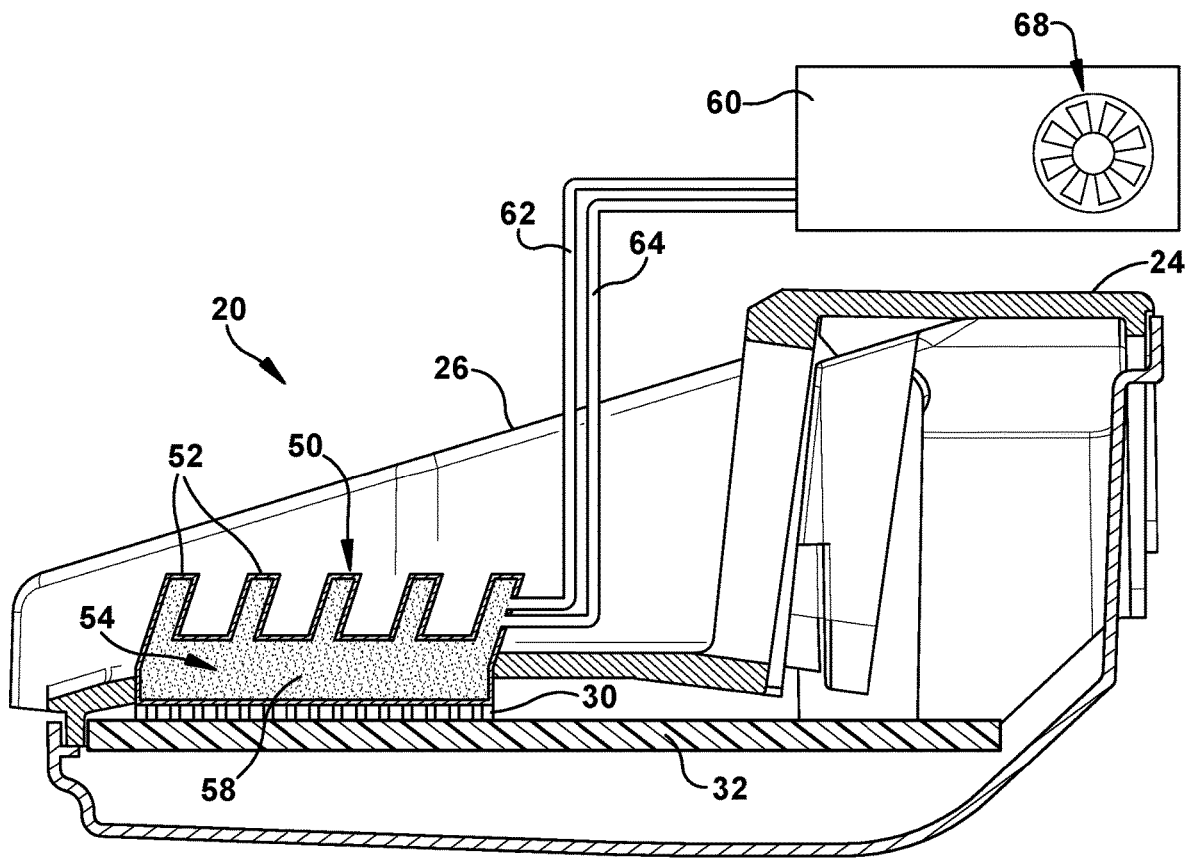
FIG. 3 is a side section view taken along line 3-3 of FIG. 2 and showing a fluid reservoir in accordance with an example embodiment of the present invention.
Figure 4:
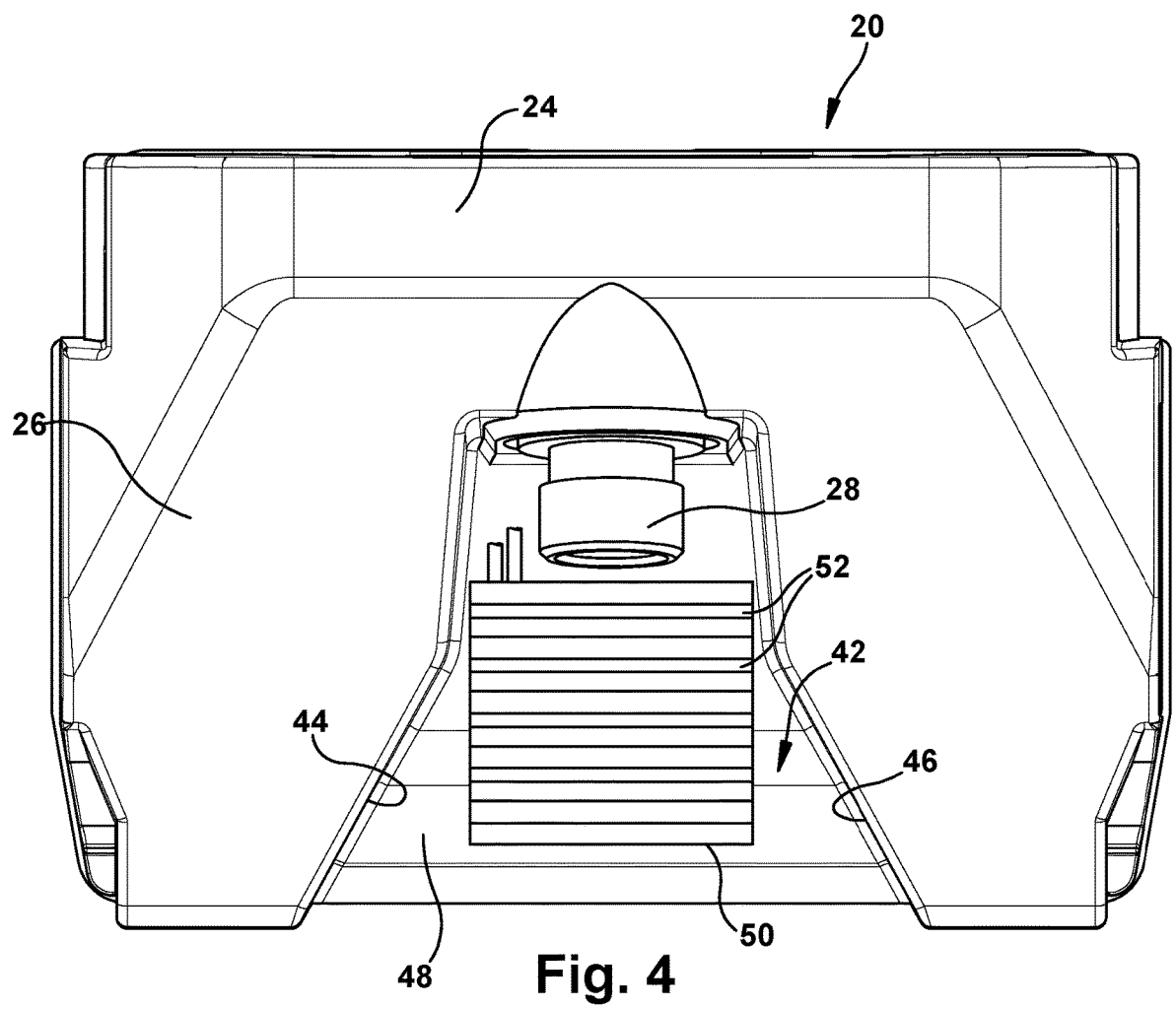
FIG. 4 is a top plan view of the driver assist system shown in FIG. 1.
Figure 5:
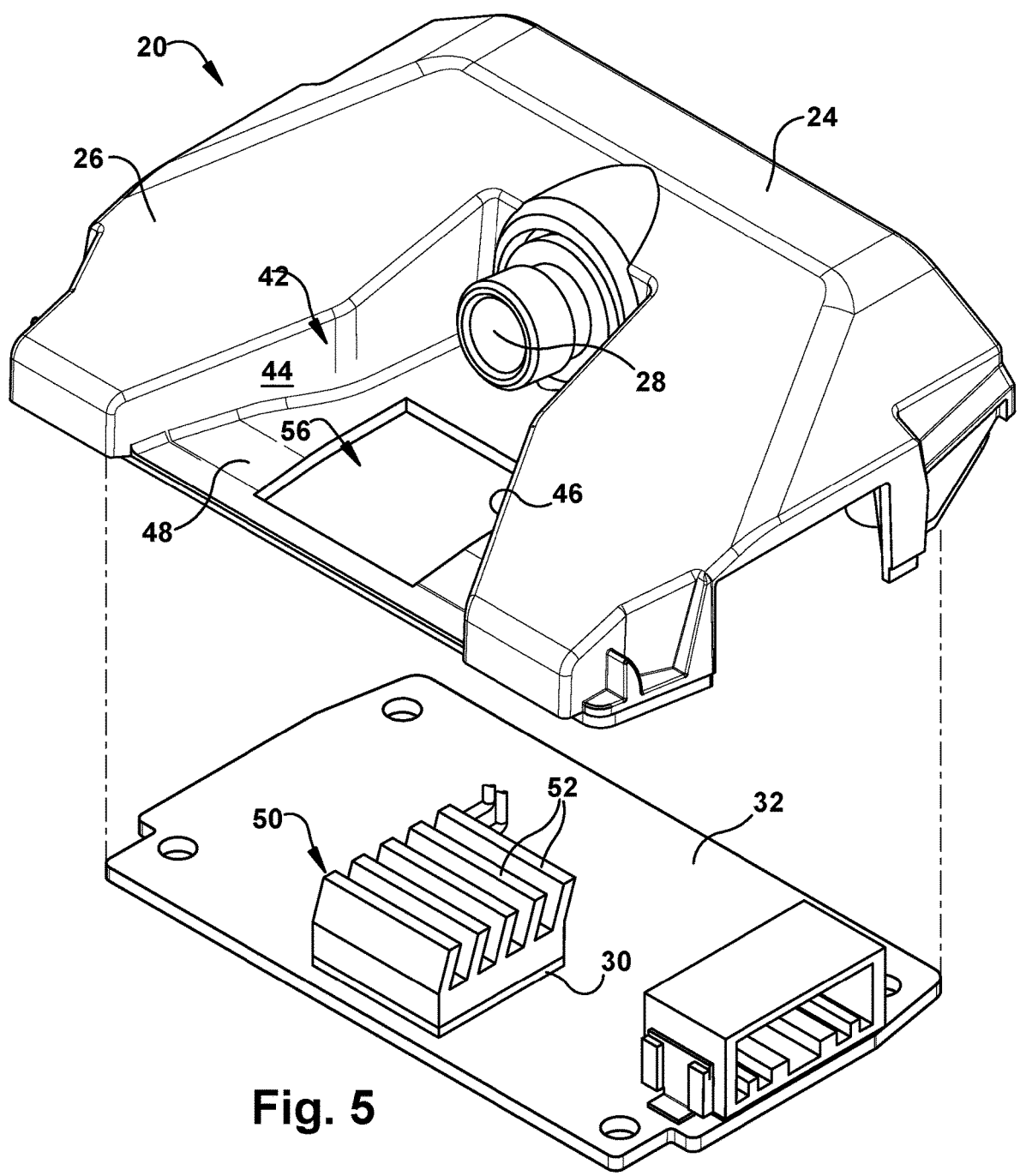
FIG. 5 is an exploded view of the driver assist system shown in FIG. 1.
Figure 6:
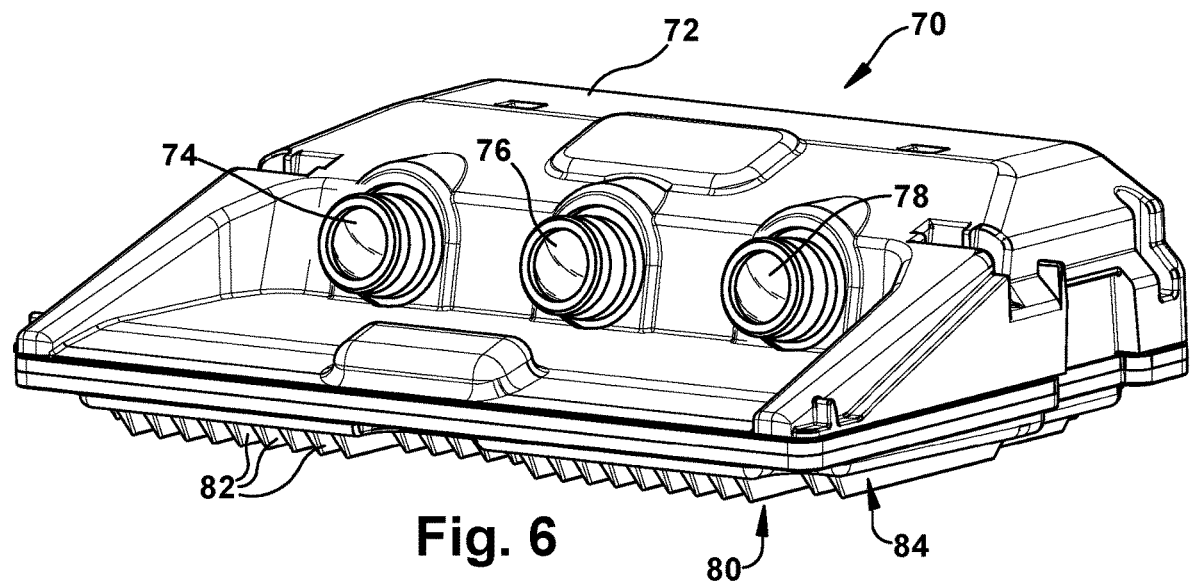
FIG. 6 is a perspective view of a driver assist system made in accordance with another example embodiment of the present invention.
Figure 7:
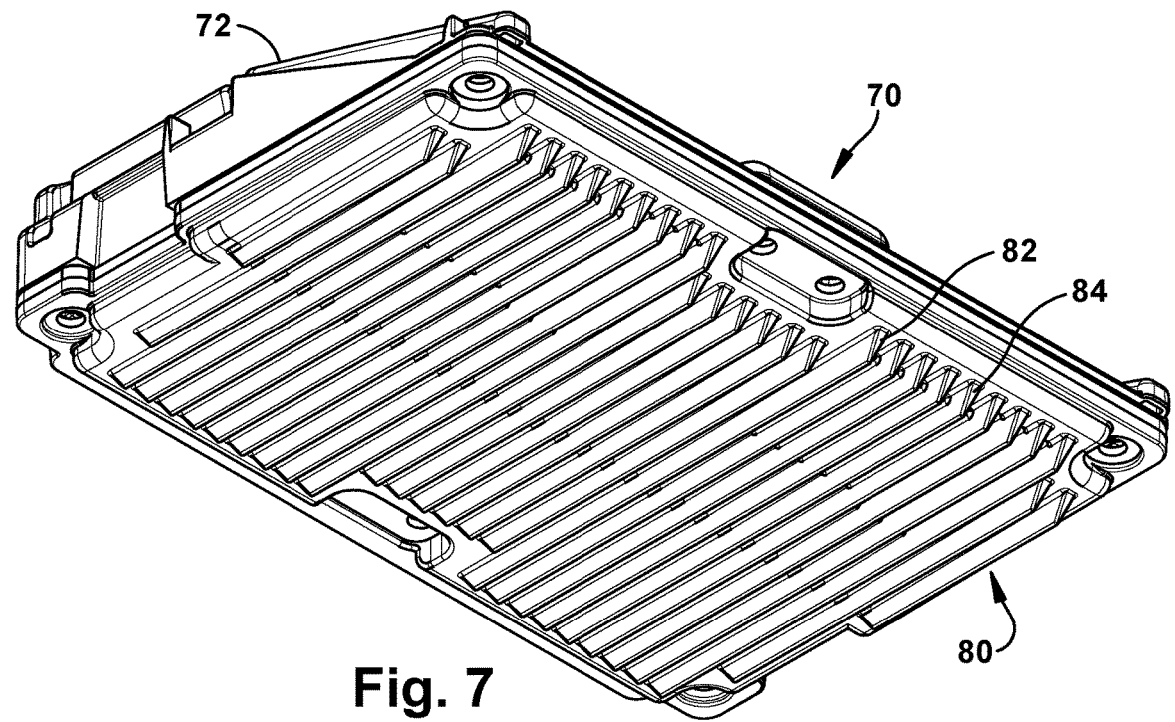
FIG. 7 is a bottom perspective view of the driver assist system shown in FIG. 6.
Figure 8:
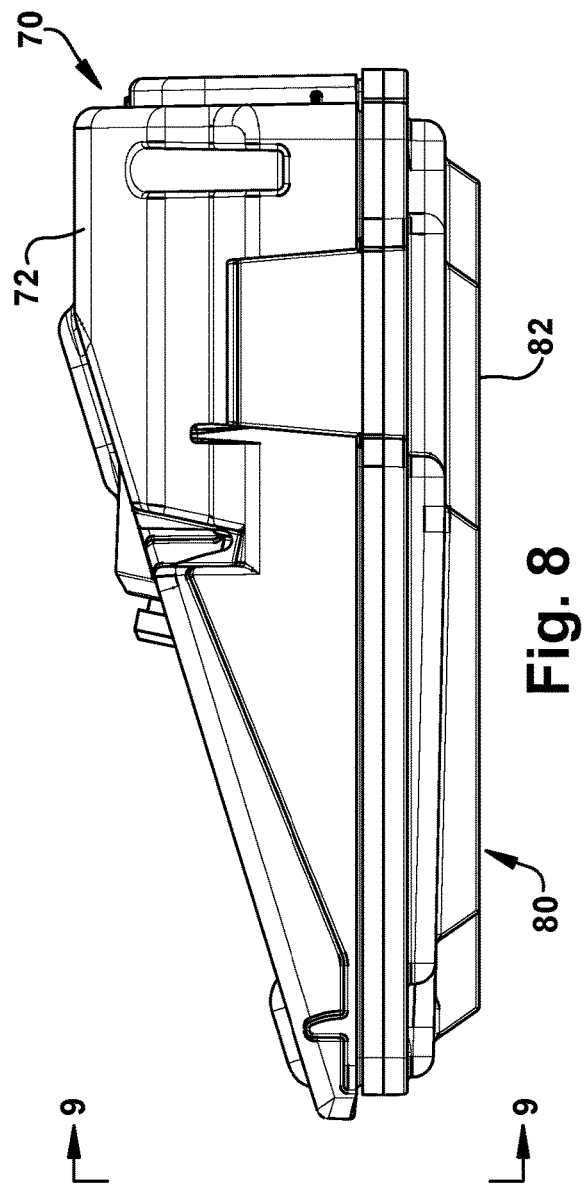
FIG. 8 is a side elevation view of the driver assist system shown in FIG. 6.
Figure 9:
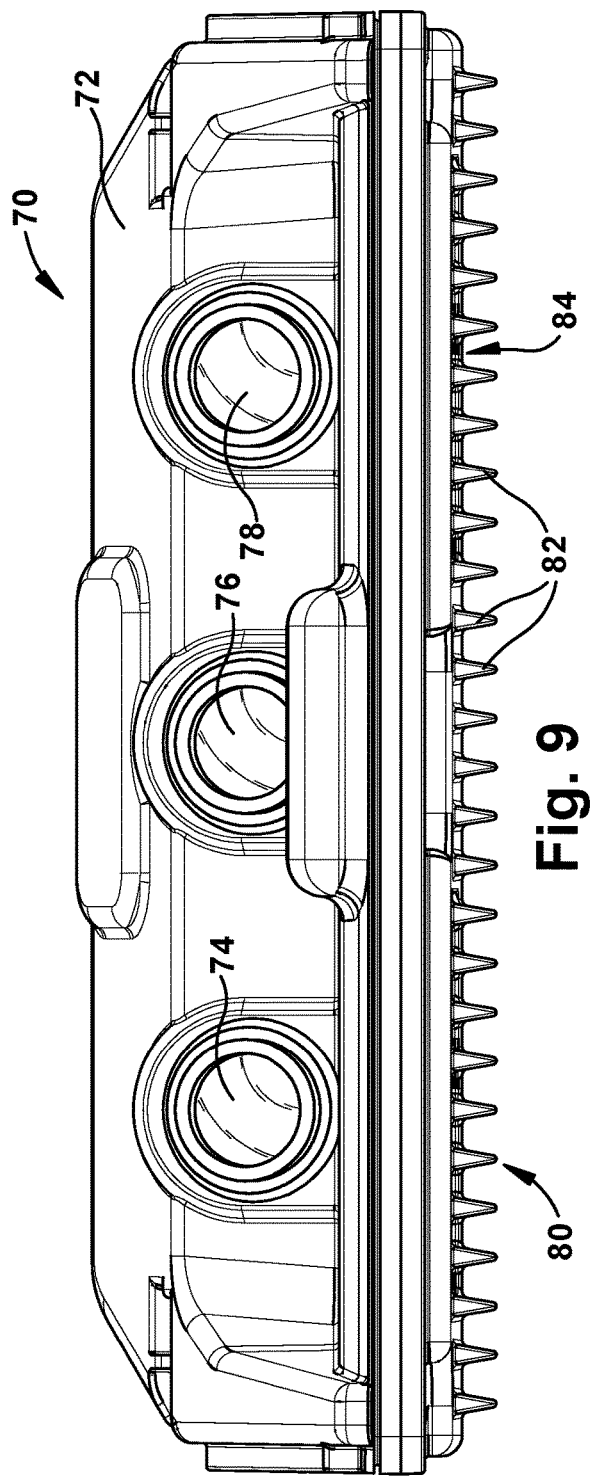
FIG. 9 is a front elevation view of the driver assist system shown in FIG. 6.
Figure 10:
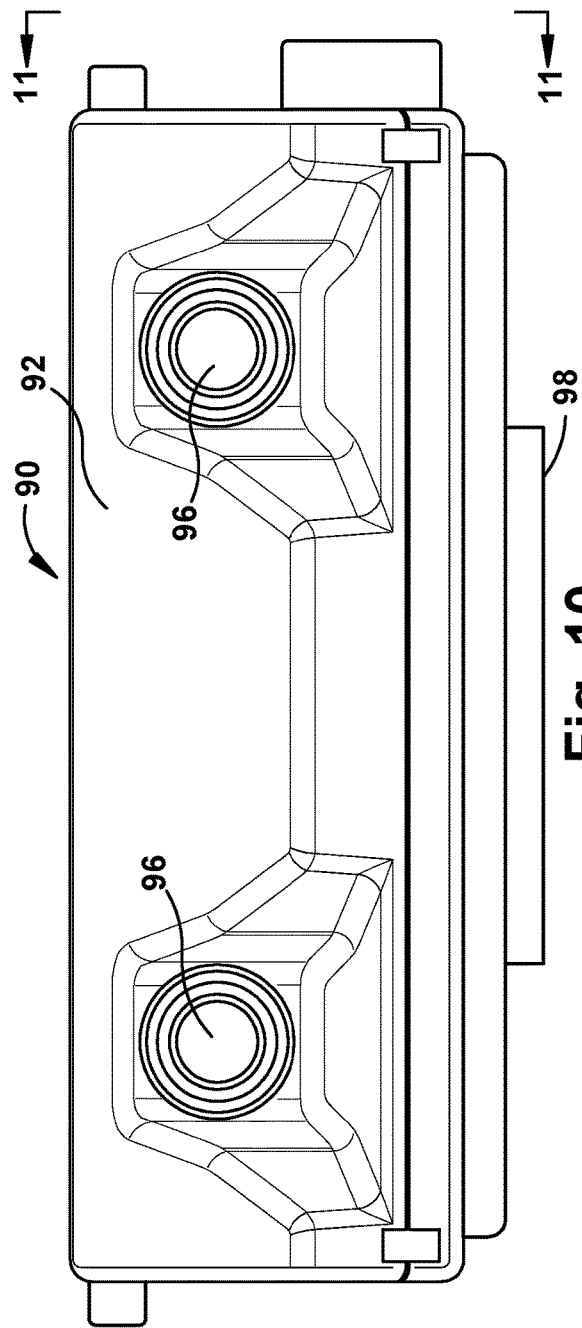
FIG. 10 is a front elevation view of a driver assist system made in accordance with yet another embodiment of the present invention.
Figure 11:
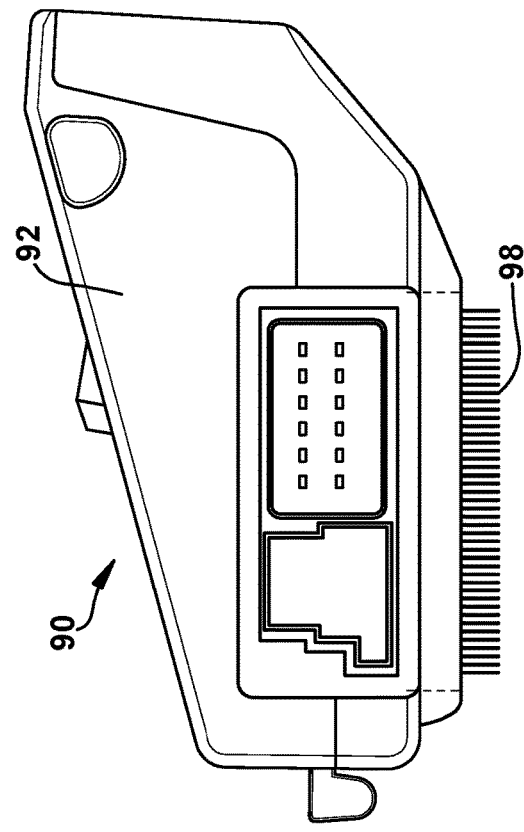
FIG. 11 is a side elevation view of the driver assist system shown in FIG. 10.

The heat sink 50 includes a plurality of cooling fins 52 extending away from the data processing circuit 30. The fins 52 may extend at an acute angle relative to an upper surface of the heat sink 50, as shown in FIG. 3. It is also contemplated that the fins 52 may extend perpendicular to the upper surface of the heat sink 50. The housing 24 includes an opening 56 extending through the bottom wall 48 defining the viewing window 42. The opening 56 is dimensioned so as to allow the heat sink 50 to extend through the housing 24 and, in particular, the fins 52 extend outside of the housing 24. The fins 52 do not extend into the field of view of the camera 28.

The inside 54 of the heat sink 50 is hollow and, according to an example embodiment of the present invention is filled with a liquid material 58. The fins 52 are also fluid filled. A fluid reservoir 60 is fluidly coupled to the heat sink 50 via an input pipe 62 and an output pipe 64. Located within the fluid reservoir 60 is a pump (not shown) arranged to circulate fluid from the reservoir 60 to and from the heat sink 50. The pump causes fluid to flow from the reservoir 60 through the input pipe 62, through the heat sink 50, and back to the reservoir through the output pipe 64. The fluid reservoir 60 further includes a cooling fan 68 arranged to dissipate heat from the fluid reservoir 60.

During operation of the driver assist system 20, the camera 28 provides detailed image data of the environment in front of the vehicle. The data processing circuit 30 processes and analyzes the image data. The operation of the data processing circuit 30 results in the generation of a significant amount of heat. At least some of the heat generated by the data processing circuit is transferred to the fluid in the heat sink 50. The heat sink 50 transfers at least some of the heat to the environment through the fins 52. The heat sink 50 dissipates the heat generated by the data processing circuit 30, thereby maintaining the DAS 20 at a proper operating temperature. The pump within the reservoir 60 circulates fluid between the fluid reservoir 60 and the heat sink 50. While the structure of the heat sink 50 including the fins 52 function to dissipate a certain amount of the generated heat, the circulating fluid between heat sink 50 and the reservoir 60 carries heat away from the data processing circuit 30 to the reservoir. Because of the volume of circulating fluid and with aid of the cooling fan 62, more heat is transferred away from the data processing circuit 30 thereby improving the overall cooling effect.

Referring to FIGS. 6-9, a driver assist system 70 is shown having a cooling system made in accordance with another example embodiment of the present invention. The driver assist system 70 includes a housing 72 designed to include a tri-camera mounting arrangement including cameras 74, 76, 78. The housing 72 would be similarly mounted to a windshield of the vehicle to view and analyze the environment in front of the vehicle. The housing 72 includes a bottom plate module 80 having a plurality of cooling fins 82 that extend downward from the housing 72 into the interior location of the vehicle cabin (not shown) when the driver assist system 70 is mounted to the windshield. The bottom plate module 80 may be connected to the housing 72 by a plurality of fasteners.

In a similar manner described with regard to the embodiment shown in FIGS. 1-5, the fins 82 are part of a large heat sink 84 that is hollow and is filled with a cooling fluid to help dissipate any heat buildup within the housing 72. The heat sink 84 could be directly coupled to a camera or data processing circuit so that the processing circuit is located between the heat sink and a printed circuit board. The heat sink 84 may support the data processing circuit and the printed circuit board in the housing 72 and close the housing 72. It is also contemplated that a data processing circuit and printed circuit board associated with each camera 74, 76, 78 may be supported on the heat sink 84. Also, the heat sink 84 could be fluidly coupled to a separate reservoir with a pump as described above for circulating cooling fluid within the heat sink for increased heat dissipation.

Referring to FIGS. 10-14 another DAS 90 is shown having a cooling arrangement made in accordance with another example embodiment of the present invention. In accordance with this example embodiment, a dual camera DAS 90 includes a housing 92 with dual cameras 94, 96. Cooling fins 98 extend outward from the bottom of the housing 92 through an appropriate dimensioned opening (not shown).

Figure 12:
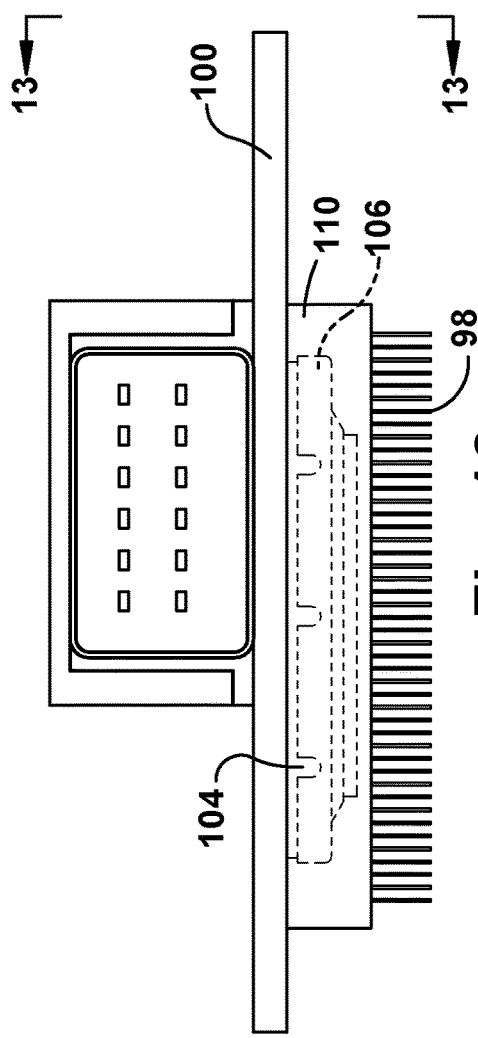
FIG. 12 is a side elevation view of a portion of the driver assist system of FIGS. 10 and 11.
Figure 13:
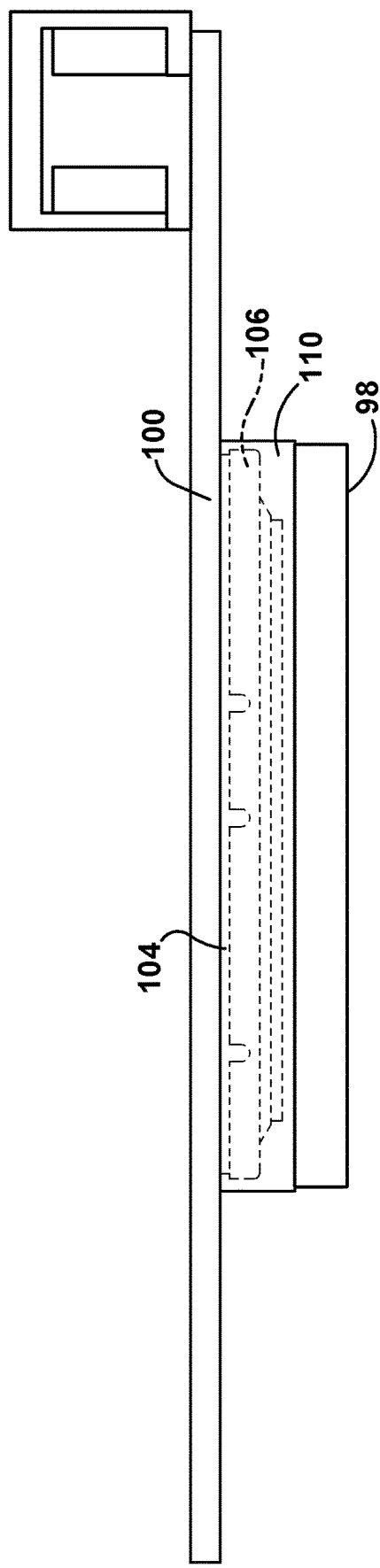
FIG. 13 is a front elevation view of the portion of the driver assist system shown in FIG. 12.

Referring in particular to FIGS. 12-13, located within the housing 92 of the DAS 90 is a printed circuit board 100. A camera or data processing circuit 104 is mounted on the printed circuit board 100. The data processing circuit 104 is encased within a fluid tight cover 106. A heat sink or coolant reservoir 110 surrounds the cover 106. The heat sink 110 is filled with cooling fluid. The cooling fluid surrounds the fluid tight cover 106. The heat sink or coolant reservoir 110 may be connected to the printed circuit board 100 in any desired manner. The cooling fins 98 extend from the heat sink 110 and are in thermal contact with the heat sink. The fins 98 may be hollow and fluid filled or may be solid. The heat sink or coolant reservoir 110 could be fluidly connected to a bigger separate reservoir (not shown) similar to that described with regard to FIGS. 1-5. A pump in the separate reservoir may circulate fluid between the heat sink or coolant reservoir 110 and the separate reservoir.

Figure 14:
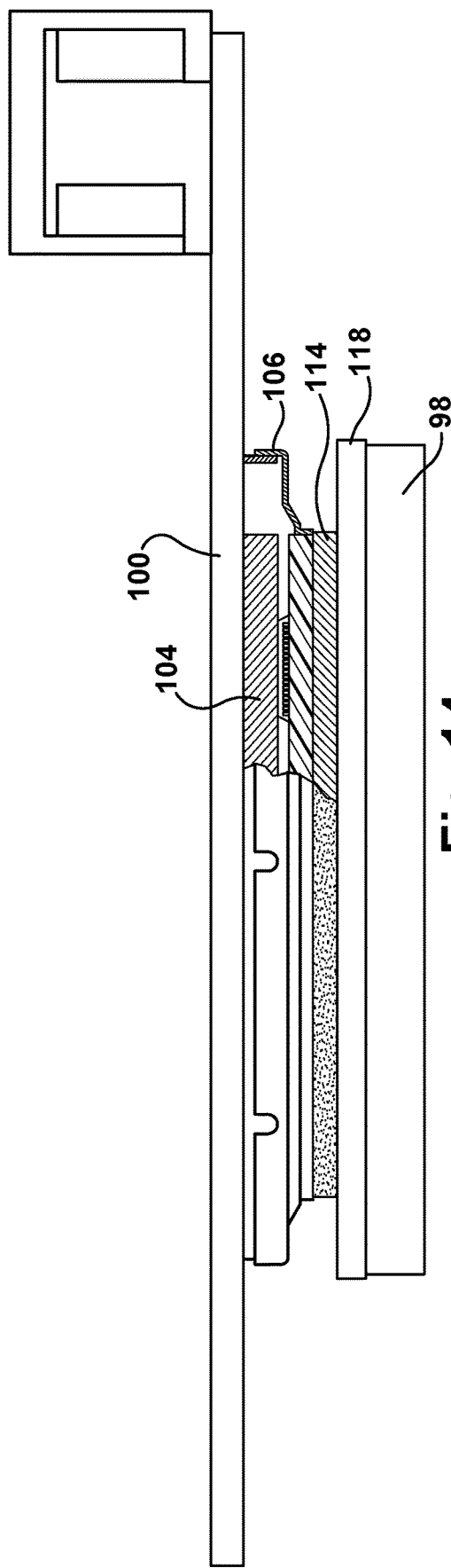
FIG. 14 is a front elevation view of a portion of a driver assist system.

Referring to FIG. 14, a variation of the cooling system from that shown in FIGS. 12-13 is shown. The cooling system in accordance with the embodiment illustrated in FIG. 14 includes a circuit housing 106 connected to the printed circuit board 100. The circuit housing 106 surrounds the data processing circuit 104. The circuit housing 106 is in thermal contact with a thermal pad 114. The thermal pad 114 is in thermal contact with a heat sink or fluid reservoir 118. The thermal pad 114 is located between the circuit housing 106 and the heat sink or fluid reservoir 118. The thermal pad 114 engages the circuit housing 106 and transfers heat from the circuit housing to the heat sink 118. The fluid reservoir 118 is in thermal contact with cooling fins 98. The cooling fins 98 extend from the heat sink or fluid reservoir 118. The cooling fins 98 could be solid or fluid filled.

Figure 15:
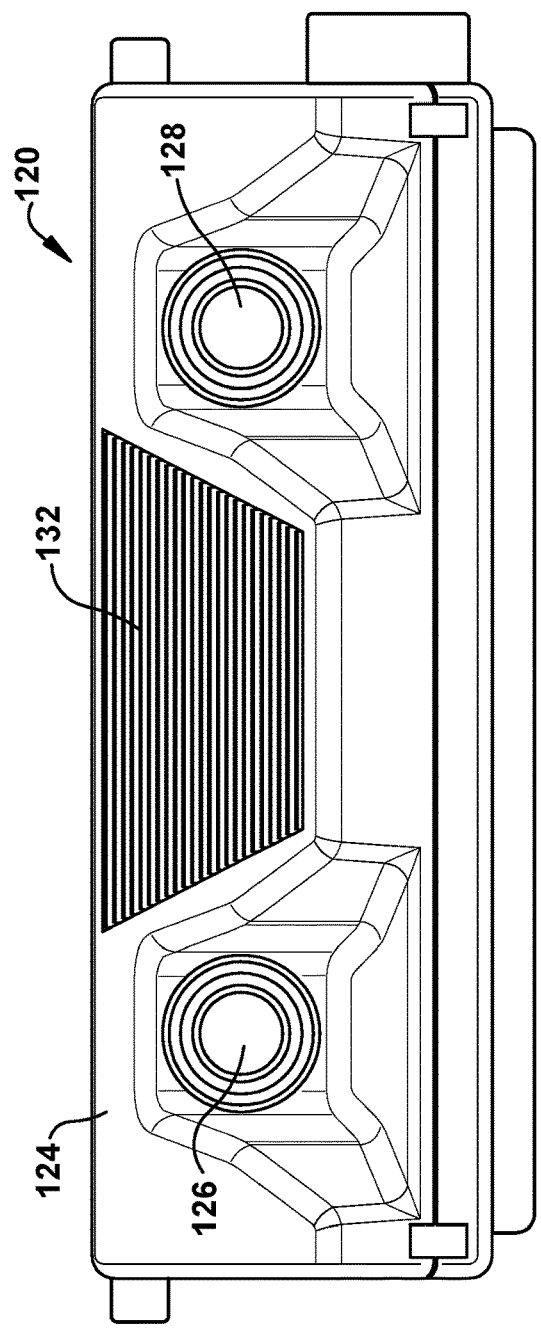
FIG. 15 front elevation view of a driver assist system made in accordance with still yet another example embodiment of the present invention.

Referring to FIG. 15, a cooling system is shown in accordance with yet another example embodiment of the present invention. A dual camera DAS 120 is shown having a housing 124 and dual cameras 126, 128. Cooling fins 132 of a heat sink extend though an opening in the top of the housing 124. The cooling fins 132 extend between the cameras 126, 128. The cooling fins 132 are in thermal contact with a fluid reservoir of the heat sink. The fluid reservoir may enclose the data or camera processing circuit or be connected to a thermal pad that conducts heat from a circuit housing enclosing the processing circuit. The cooling fins 132 could be solid or fluid filled.

In accordance with the cooling system of the present invention, the cooling arrangements dissipate heat generated by the data processing circuit to maintain the driver assist system at a proper operating temperature. The fluid or coolant reservoirs increase the amount of heat that is dissipated.

From the above description of the present invention, those skilled in the art will perceive improvements, changes and modifications. Such improvements, changes and modifications within the skill of the art are intended to be covered by the appended claims.

Having described the present invention, the following is claimed:

1. A driver assist system for a vehicle comprising:
a housing;
a camera extending from the housing;
a data processing circuit mounted within the housing for processing and analyzing image data provided by the camera; and
a fluid filled heat sink that transfers heat from the data processing circuit to the environment for cooling the data processing circuit, the heat sink including fins extending through an opening into a camera viewing window of the housing and away from the data processing circuit into the vehicle when the driver assist system is connected to the vehicle.

2. The driver assist system of claim 1 further including a reservoir in fluid communication with the heat sink and a pump for circulating fluid from the reservoir through the heat sink.

3. The driver assist system of claim 1 wherein the fins are fluid filled.

4. The driver assist system of claim 1 wherein the fins are solid.

5. The driver assist system of claim 1 wherein the fins extend through an opening in a bottom wall defining the camera viewing window.

6. A driver assist system for a vehicle comprising:
a housing;
a camera extending from the housing;
a data processing circuit mounted within the housing for processing and analyzing image data provided by the camera; and
a fluid filled heat sink that transfers heat from the data processing circuit to the environment for cooling the data processing circuit and closes the housing.

7. The driver assist system of claim 1 wherein the heat sink engages the data processing circuit.

8. The driver assist system of claim 6 wherein a fluid tight cover encases the data processing circuit and the heat sink surrounds the fluid tight cover.

9. The driver assist system of claim 8 wherein the heat sink is directly connected to a printed circuit board to which the data processing circuit is connected.

10. The driver assist system of claim 9 wherein the heat sink includes fins extending away from the data processing circuit.

11. The driver assist system of claim 6 wherein a circuit housing surrounds the data processing circuit, a thermal pad engages the circuit housing and transfers heat from the circuit housing to the heat sink.

12. The driver assist system of claim 11 wherein the circuit housing is directly connected to a printed circuit board to which the data processing circuit is connected.

13. The driver assist system of claim 6 further including a reservoir in fluid communication with the heat sink and a pump for circulating fluid from the reservoir through the heat sink.

14. The driver assist system of claim 6 wherein the heat sink includes fins extending away from the data processing circuit into the vehicle when the driver assist system is connected to the vehicle.

15. The driver assist system of claim 14 wherein the fins are fluid filled.

16. The driver assist system of claim 14 wherein the fins are solid.

17. The driver assist system of claim 6 wherein the heat sink engages the data processing circuit.

* * * * *